(12) United States Patent
Li

(10) Patent No.: US 7,917,742 B2
(45) Date of Patent: Mar. 29, 2011

(54) CMOS CLEARING CIRCUIT

(75) Inventor: Kun-Peng Li, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 883 days.

(21) Appl. No.: 11/762,787

(22) Filed: Jun. 14, 2007

(65) Prior Publication Data

US 2008/0229087 A1  Sep. 18, 2008

(30) Foreign Application Priority Data

Mar. 13, 2007 (CN) .................. 2007 2 0200142 U

(51) Int. Cl.
*G06F 1/24* (2006.01)
*G06F 9/00* (2006.01)
*G06F 15/177* (2006.01)

(52) U.S. Cl. .................................. 713/1; 713/100

(58) Field of Classification Search ............... 713/1, 100
See application file for complete search history.

(56) References Cited

U.S. PATENT DOCUMENTS

| | | | | |
|---|---|---|---|---|
| 6,047,373 A * | 4/2000 | Hall et al. | | 713/1 |
| 6,253,319 B1 | 6/2001 | Tran et al. | | |
| 2003/0236928 A1 * | 12/2003 | Wang et al. | | 710/8 |
| 2009/0259859 A1 * | 10/2009 | Zou et al. | | 713/300 |
| 2010/0090729 A1 * | 4/2010 | Shi | | 327/143 |

* cited by examiner

*Primary Examiner* — Mark Connolly
(74) *Attorney, Agent, or Firm* — Frank R. Niranjan

(57) ABSTRACT

A CMOS clearing circuit mounted on a motherboard of a computer includes a south bridge chip and a switch member respectively mounted on the motherboard. The south bridge chip includes a reset terminal and an input terminal. The switch member is configured for controlling one of the reset terminal and the input terminal of the south bridge chip. If the switch member controls the reset terminal, the input terminal is disconnected from the switch member and the switch member is capable of controlling the reset terminal of the south bridge chip to be selectively connected to ground or a voltage source provided by the motherboard. If the switch member controls the input terminal, the reset terminal stays connected to the voltage source and the switch member is capable of controlling the input terminal of the south bridge chip to be selectively connected to ground or the voltage source.

9 Claims, 3 Drawing Sheets

CMOS CLEARING CIRCUIT

BACKGROUND OF THE INVENTION

1. Field of the Invention

The present invention relates to CMOS clearing circuits, particularly to a CMOS clearing circuit capable of choosing clearing method.

2. Description of Related Art

CMOS is a readable and writable memory integrated in a south bridge chip mounted on a computer motherboard, which is made of complementary metal oxide semiconductor, for storing hardware configuration of a current computer system and parameters set by users. CMOS parameters are often set by a CMOS setting program in a BIOS (Basic Input & Output System) chip. After CMOS parameters are set, the parameters are stored in the south bridge chip. Once the computer is restarted, the parameters will be adopted in the POST (Power On Self Test) process for changing hardware configuration. Users can enter the CMOS setting program in BIOS via pressing a specific key of the computer to set CMOS parameters as soon as the computer is started. The CMOS data stored in the south bridge chip is changed after setting the parameters. However, the computer may not be able to work normally if the CMOS parameters are set wrong, and users cannot enter computer system to amend CMOS data again. At this time, a method for rescuing the computer is to clear CMOS data stored in the south bridge chip. Conventionally, one CMOS clearing method is to directly clear CMOS data in the south bridge chip via hardware. Another CMOS clearing method is to clear CMOS data via BIOS when the computer is started. Generally, only one method is used in the computer motherboard. However, in actual use, different users may need different CMOS clearing methods. The motherboard that only uses one CMOS clearing method cannot meet different requirements of different customers.

What is needed, therefore, is a CMOS clearing circuit capable of applying different CMOS clearing methods to satisfy different customer requirements.

SUMMARY OF THE INVENTION

A CMOS clearing circuit mounted on a motherboard of a computer includes a south bridge chip and a switch member respectively mounted on the motherboard. The south bridge chip includes a reset terminal and an input terminal. The switch member is configured for controlling one of the reset terminal and the input terminal of the south bridge chip. If the switch member controls the reset terminal, the input terminal is disconnected from the switch member and the switch member is capable of controlling the reset terminal of the south bridge chip to be selectively connected to ground or a voltage source provided by the motherboard. If the switch member controls the input terminal, the reset terminal stays connected to the voltage source and the switch member is capable of controlling the input terminal of the south bridge chip to be selectively connected to ground or the voltage source.

Other advantages and novel features of the present invention will become more apparent from the following detailed description of preferred embodiment when taken in conjunction with the accompanying drawings, in which:

DETAILED DESCRIPTION OF THE INVENTION

Figure 1:
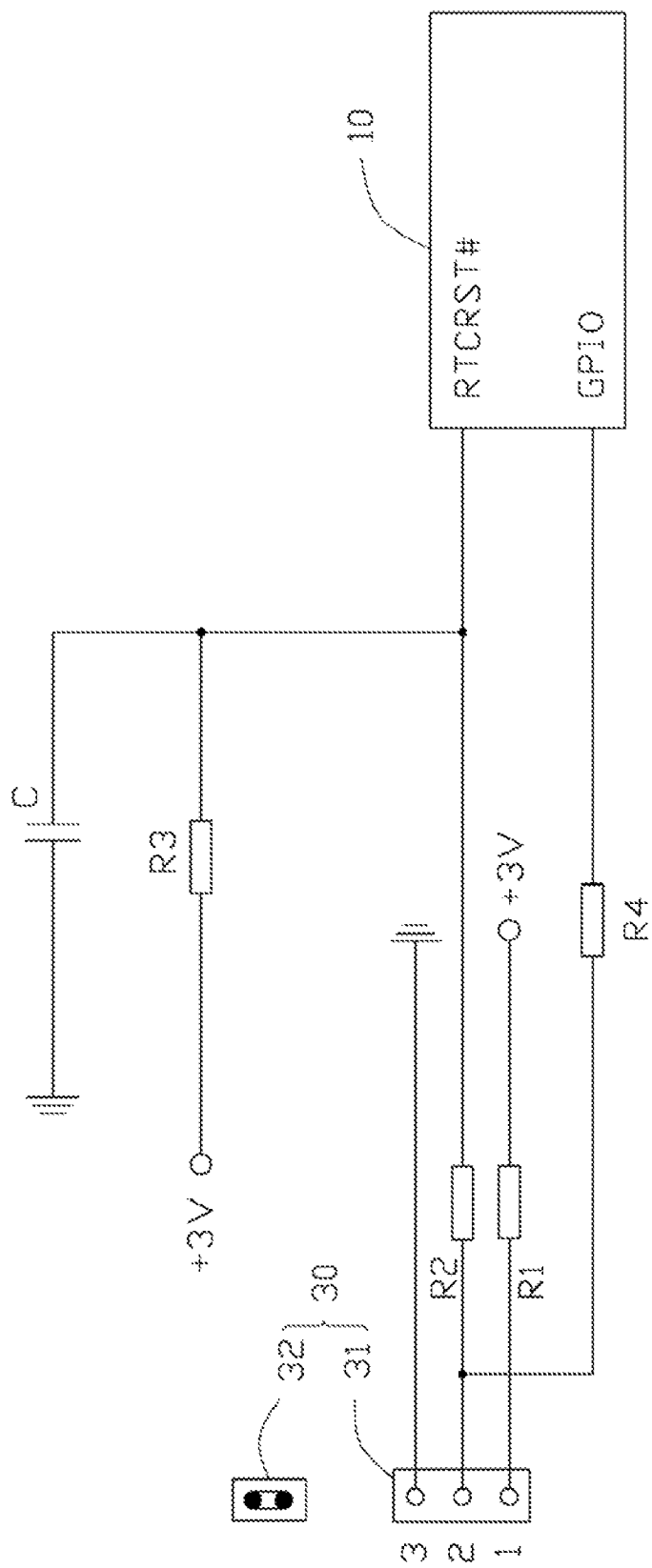
FIG. 1 is a circuit diagram of a CMOS clearing circuit arranged on a motherboard in accordance with a preferred embodiment.

Referring to FIG. 1, a CMOS clearing circuit provided on a motherboard in accordance with a preferred embodiment includes a south bridge chip 10 mounted in a computer and a switch member 30 connected to the south bridge chip 10. The south bridge chip 10 has a reset terminal RTCRST# and an input terminal GPIO. The switch member 30 includes a header 31 and a jumper 32. The header 31 has 3 pins aligned in parallel. Pin 1 of the header 31 is connected to a +3V voltage source on the motherboard via a resistor. Pin 3 of the header 31 is connected to ground. The reset terminal RTCRST# is connected to pin 2 of the header 31 via a resistor R2, and is simultaneously connected to the +3V voltage source and ground respectively via a resistor R3 and a capacitor C. The input terminal GPIO of the south bridge chip 10 is connected to pin 2 of the header 31 via a resistor R4. The jumper 32 has two pins for connecting to any two adjacent pins of the header 31. When the signal of the reset terminal RTCRST# is at low level, the south bridge chip 10 will directly execute a command of clearing CMOS. This is called hardware clearing method. When the input terminal GPIO receives a low level signal, powering on the computer, BIOS in the computer executes a command of clearing CMOS. This is called software clearing method.

Figure 2:
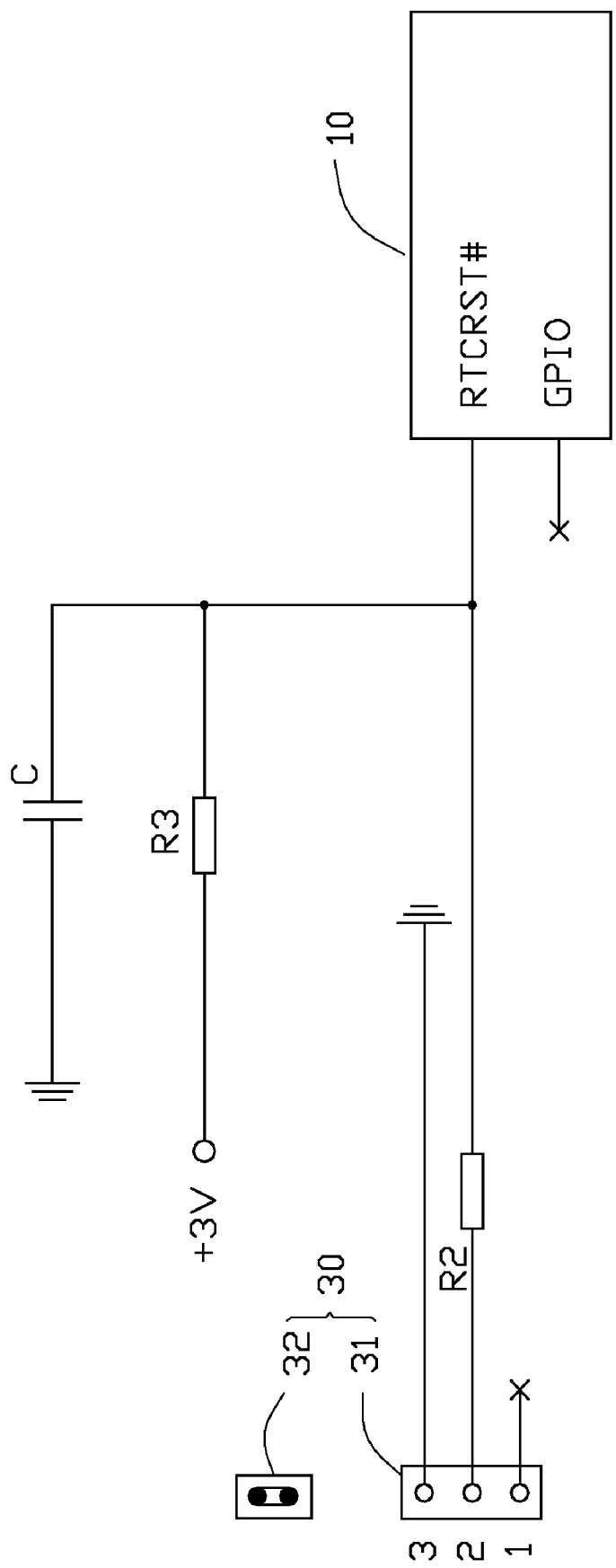
FIG. 2 is an equivalent circuit diagram of the CMOS clearing circuit in FIG. 1 when using a hardware clearing method.

When using the hardware clearing method, the resistors R1 and R4 do not need to be mounted on the motherboard. The equivalent circuit of the CMOS clearing circuit is shown in FIG. 2. The reset terminal RTCRST# of the south bridge chip 10 is connected to pin 2 of the header 31. The input terminal GPIO of the south bridge chip 10 is disconnected. When the jumper 32 is inserted on pins 1 and 2 of the header 31, the reset terminal RTCRST# is directly connected to the +3V voltage source and the signal at the reset terminal RTCRST# is pulled up to a high level. The CMOS data will not be cleared. The computer can be started according to the CMOS information stored in the south bridge chip 10. When the jumper 32 is inserted on the pins 2 and 3 of the header 31, the reset terminal RTCRST# will be connected to ground via the resistor R2, and the signal at the reset terminal RTCRST# is pulled down to a low level. The south bridge chip 10 executes the command of clearing CMOS data. After the CMOS data is cleared, the jumper 32 is reinserted into pins 1 and 2 of the header 31, and the signal at the reset terminal RTCRST# returns to high level. Then, powering on the computer, when BIOS in the computer detects CMOS data in the south bridge 10 is lost, the computer is started normally according to initial parameters stored in the BIOS.

Figure 3:
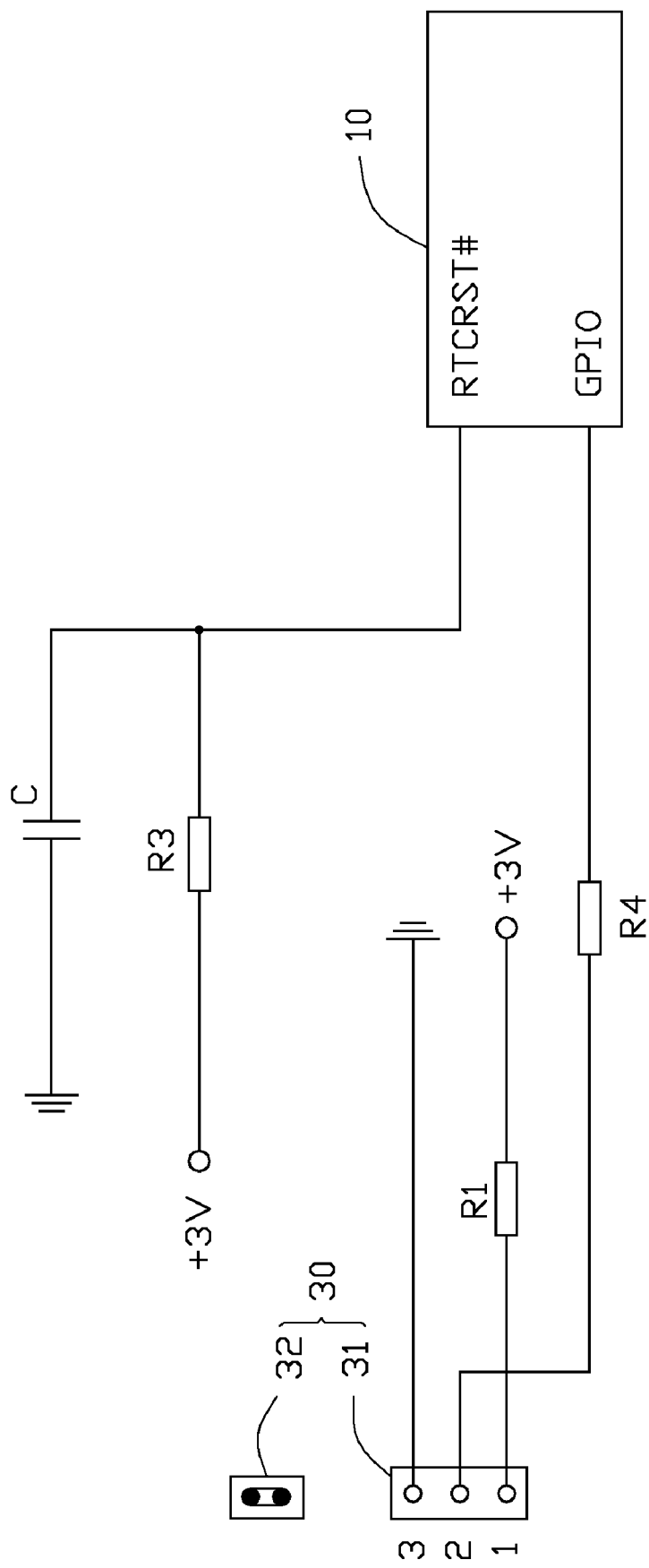
FIG. 3 is an equivalent circuit diagram of the CMOS clearing circuit in FIG. 1 when using a software clearing method.

When users choose the software clearing method to clear CMOS data in the south bridge chip 10, the resistor R2 does not need to be mounted on the motherboard. The equivalent circuit of the CMOS clearing circuit is shown as FIG. 3. The reset terminal RTCRST# of the south bridge chip 10 is connected to the +3V voltage source via the resistor R3. The signal at reset terminal RTCRST# is pulled up to a high level. The CMOS data will not be cleared. The input terminal GPIO of the south bridge chip 10 is connected to pin 2 of the header 31 via the resistor R4. Pin 1 of the header 31 is connected to the +3V voltage source via the resistor R1. Pin 3 of the header 31 is connected to ground. When the jumper 32 is connected to pins 1 and 2 of the header 31, the input terminal GPIO of the south bridge chip 10 is connected to the +3V voltage source. Signal at the input terminal GPIO is pulled up to a high level. Powering on the computer, BIOS will not clear CMOS data in the south bridge chip 10 when sensing the high level signal at the input terminal GPIO, and the computer is started normally. When the jumper 32 is connected to pins 2 and 3 of the header 31, the input terminal GPIO is connected to ground via the resistor R4. The signal at input terminal GPIO is pulled down to a low level. Powering on the computer at this time, BIOS senses the low level signal at the input terminal GPIO and executes a command of clearing CMOS data in the south bridge chip 10. The jumper 32 is reinserted into pins 1 and 2 of the header 31 after clearing the CMOS data. The signal at the input terminal GPIO of the south bridge chip 10 returns to a high level. Then upon powering up the computer again, BIOS detects CMOS data in the south bridge chip 10 is lost, and the computer is started normally according to the initial parameters in BIOS.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A CMOS clearing circuit mounted on a motherboard of a computer, comprising:
   a south bridge chip mounted on the motherboard having a reset terminal and an input terminal;
   a switch member mounted on the motherboard and connected to the south bridge chip configured for controlling one of the reset terminal and the input terminal of the south bridge chip;
   wherein if the switch member controls the reset terminal, the input terminal is disconnected from the switch member and the switch member is capable of controlling the reset terminal of the south bridge chip to be selectively connected to ground or a voltage source provided by the motherboard, and if the switch member controls the input terminal, the reset terminal stays connected to the voltage source and the switch member is capable of controlling the input terminal of the south bridge chip to be selectively connected to ground or the voltage source.

2. The CMOS clearing circuit as described in claim 1, wherein the switch member comprises a header having first, second, and third pins sequentially arranged in a line and a jumper optionally connected to any two adjacent pins of the header for allowing communication therebetween.

3. The CMOS clearing circuit as described in claim 2, wherein while the switch member controls the reset terminal of the south bridge chip, the first pin is not used, the third pin is connected to ground, and the reset terminal of the south bridge chip is connected to the second pin of the header via a resistor.

4. The CMOS clearing circuit as described in claim 2, wherein while the switch member controls the input terminal of the south bridge chip, the first pin is connected to the voltage source via a resistor, the third pin is connected to ground, and the input terminal of the south bridge chip is connected to the second pin via another resistor.

5. A CMOS clearing circuit, comprising:
   a south bridge chip mounted on a computer for storing CMOS data, comprising a reset terminal and an input terminal configured for connecting with a BIOS chip, wherein when a signal at the reset terminal is at a logic low level, CMOS data in the south chip is directly cleared, and when a signal at the input terminal is at a logic low level, CMOS data in the south chip is cleared by BIOS when the computer is powered up;
   a switch member being connected to the reset terminal of the south bridge chip for controlling the signal at the reset terminal to vary between a logic high level and a logic low level, or being connected to the input terminal of the south bridge chip for controlling the signal at the input terminal to vary between a logic high level and a logic low level; wherein if the reset terminal is connected to the switch, the input terminal is disconnected from the switch; and if the input terminal is connected to the switch, the reset terminal is always at a high level.

6. The CMOS clearing circuit as described in claim 5, wherein the switch member comprises a header having a first pin, a second pin, and a third pin sequentially arranged in a line and a jumper optionally connected to any two adjacent pins of the header for allowing communication between the two adjacent pins.

7. The CMOS clearing circuit as described in claim 6, wherein while the switch member controls the reset terminal of the south bridge chip, the first pin is not used, the third pin is connected to ground, and the reset terminal of the south bridge chip is connected to the second pin of the header via a resistor.

8. The CMOS clearing circuit as described in claim 7, wherein the reset terminal of the south bridge chip is connected to a voltage source and ground respectively via another resistor and a capacitor.

9. The CMOS clearing circuit as described in claim 6, wherein while the switch member controls the input terminal of the south bridge chip, the first pin is connected to a voltage source via a resistor, the third pin is connected to ground, and the input terminal of the south bridge chip is connected to the second pin of the header via another resistor.

* * * * *